(12) United States Patent
Wu

(10) Patent No.: US 8,085,057 B2
(45) Date of Patent: Dec. 27, 2011

(54) PROBE DEVICE HAVING FIRST AND SECOND PROBE PINS

(76) Inventor: Chun-Chieh Wu, Kaohsiung (TW)

( * ) Notice: Subject to any disclaimer, the term of this patent is extended or adjusted under 35 U.S.C. 154(b) by 242 days.

(21) Appl. No.: 12/557,842

(22) Filed: Sep. 11, 2009

(65) Prior Publication Data

US 2011/0062980 A1    Mar. 17, 2011

(51) Int. Cl.
*G01R 31/20* (2006.01)
*G01R 1/067* (2006.01)
*G01R 31/00* (2006.01)

(52) U.S. Cl. .......... 324/754.01; 324/755.07; 324/756.04

(58) Field of Classification Search .. 324/754.01–754.3, 324/762.01–762.09, 755.01–755.11, 765.01–756.05; 257/48; 438/14–18
See application file for complete search history.

(56) References Cited

U.S. PATENT DOCUMENTS

| 5,410,260 A * | 4/1995 | Kazama ................... 324/755.05 |
| 6,992,496 B2 * | 1/2006 | Winter et al. ............. 324/750.25 |
| 7,372,286 B2 * | 5/2008 | Lee et al. ................. 324/754.18 |

* cited by examiner

*Primary Examiner* — Huy Q Phan
*Assistant Examiner* — Tung X Nguyen
(74) *Attorney, Agent, or Firm* — Steptoe & Johnson LLP

(57) ABSTRACT

A probe device includes a probe body having a plurality of first holes extending through a first face thereof and a plurality of second holes aligned with the first holes and extending through an opposite second face thereof, a plurality of spaced-apart first probe pins inserted fittingly and removably into respective first holes and each including a first contact portion extending out of the first face, and a first connecting portion extending into the respective first hole, and a plurality of spaced-apart second probe pins inserted fittingly and removably into respective second holes and each including a second contact portion extending out of the second face, and a second connecting portion extending into the respective second hole and having an insert space. The first connecting portion is inserted fittingly and removably into the insert space, and mates with the second connecting portion.

6 Claims, 5 Drawing Sheets

PROBE DEVICE HAVING FIRST AND SECOND PROBE PINS

BACKGROUND OF THE INVENTION

1. Field of the Invention

This invention relates to a probe device, more particularly to a probe device having first and second probe pins.

2. Description of the Related Art

Referring to FIG. 1, a conventional probe device 1 includes a hollow first probe pin 11 disposed in a probe hole 101 of a probe body 100 and having an upper contact portion 111 projecting outwardly from the probe body 100 to contact electrically a test point 300 of a device under test 30, a second probe pin 12 having one end inserted into the first probe pin 11 and the other opposite end having a lower contact portion 121 projecting outwardly from the probe body 100 to contact electrically a receive point 400 of a testing apparatus 40, and a biasing element 13 disposed within the first probe pin 11 and having two opposite ends abutting respectively against the first and second probe pins 11, 12. During testing, through electrical contact between the upper contact portion 111 and the test point 300 and between the lower contact portion 121 and the receive point 400, a signal generated by the device under test 30 is transmitted to an analyzer (not shown) through the probe device 1 for analyzing the signal.

However, when the first or second probe pin 11, 12 is rendered unusable due to wear of the upper or lower contact portion 111, 121 thereof, since one end of the second probe pin 12 is inserted inside the hollow first probe pin 11, as shown in FIG. 1, it is difficult to replace only the first or second probe pin 11, 12. Instead, the entire probe device 1 must be replaced with a new one. This is not only costly and wasteful, but also results in delaying the test operation.

SUMMARY OF THE INVENTION

Therefore, the object of the present invention is to provide a probe device having first and second probe pins that is capable of overcoming the aforementioned drawbacks of the prior art.

According to this invention, a probe device for connecting electrically a device under test to a testing apparatus comprises a probe body, a plurality of spaced-apart first probe pins, and a plurality of spaced-apart second probe pins. The probe body is made of an elastomeric material, and has a first face provided with a plurality of first holes extending through the first face, and a second face opposite to the first face and having a plurality of second holes aligned with the first holes and extending through the second face. Each of the first probe pins is inserted fittingly and removably into one of the first holes, and includes a first contact portion extending out of the first face, and a first connecting portion extending into a respective one of the first holes. Each of the second probe pins is inserted fittingly and removably into one of the second holes, and includes a second contact portion extending out of the second face, and a second connecting portion extending into a respective one of the second holes and having an insert space. The first connecting portion is inserted fittingly and removably into the insert space, and mates with the second connecting portion.

BRIEF DESCRIPTION OF THE DRAWINGS

Other features and advantages of the present invention will become apparent in the following detailed description of the preferred embodiments of the invention, with reference to the accompanying drawings, in which.

DETAILED DESCRIPTION OF THE PREFERRED EMBODIMENTS

Figure 1:
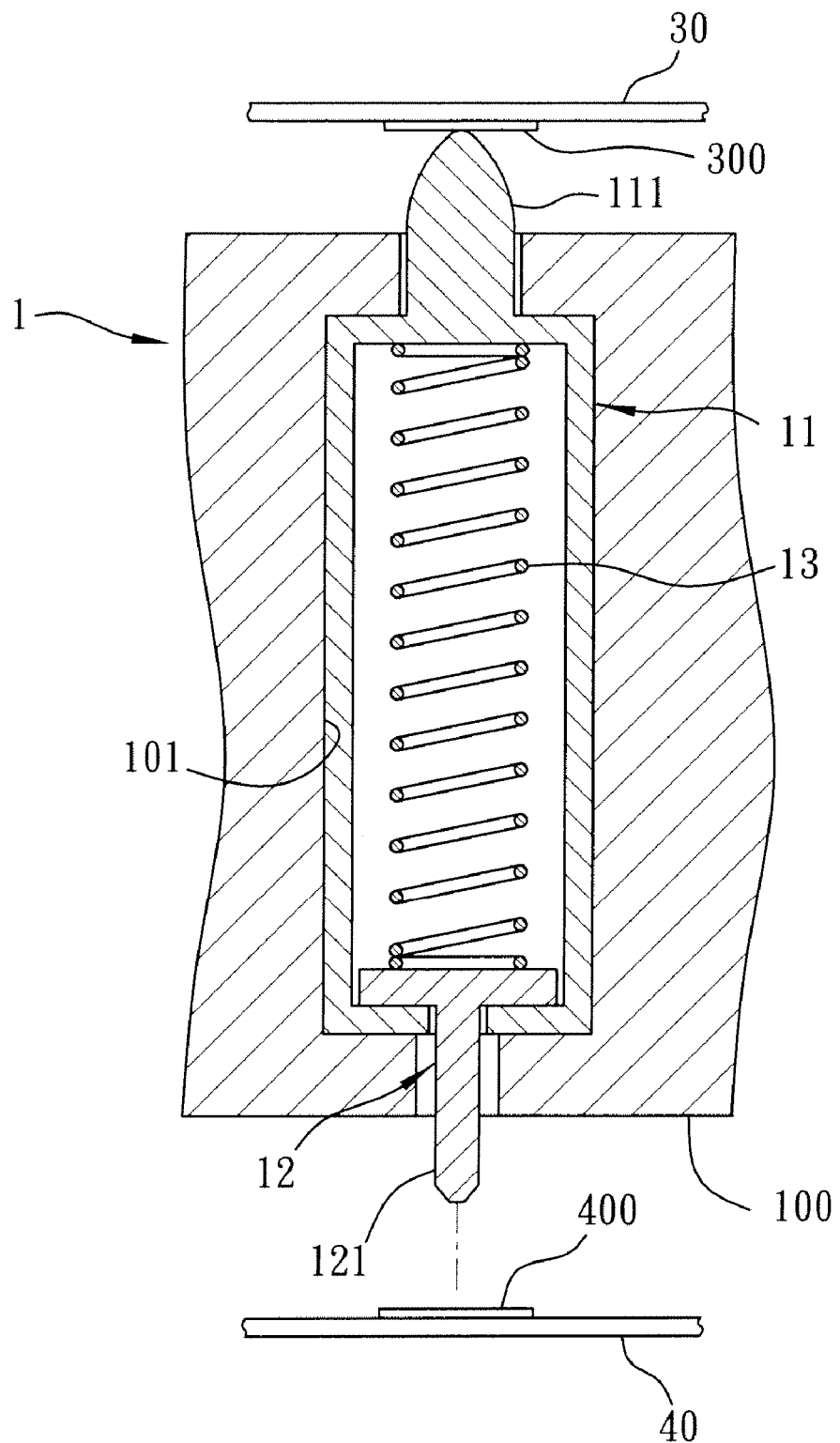
FIG. 1 is a fragmentary sectional view of a conventional probe device.

Before the present invention is described in greater detail, it should be noted that the same reference numerals have been used to denote like elements throughout the specification.

Figure 2:
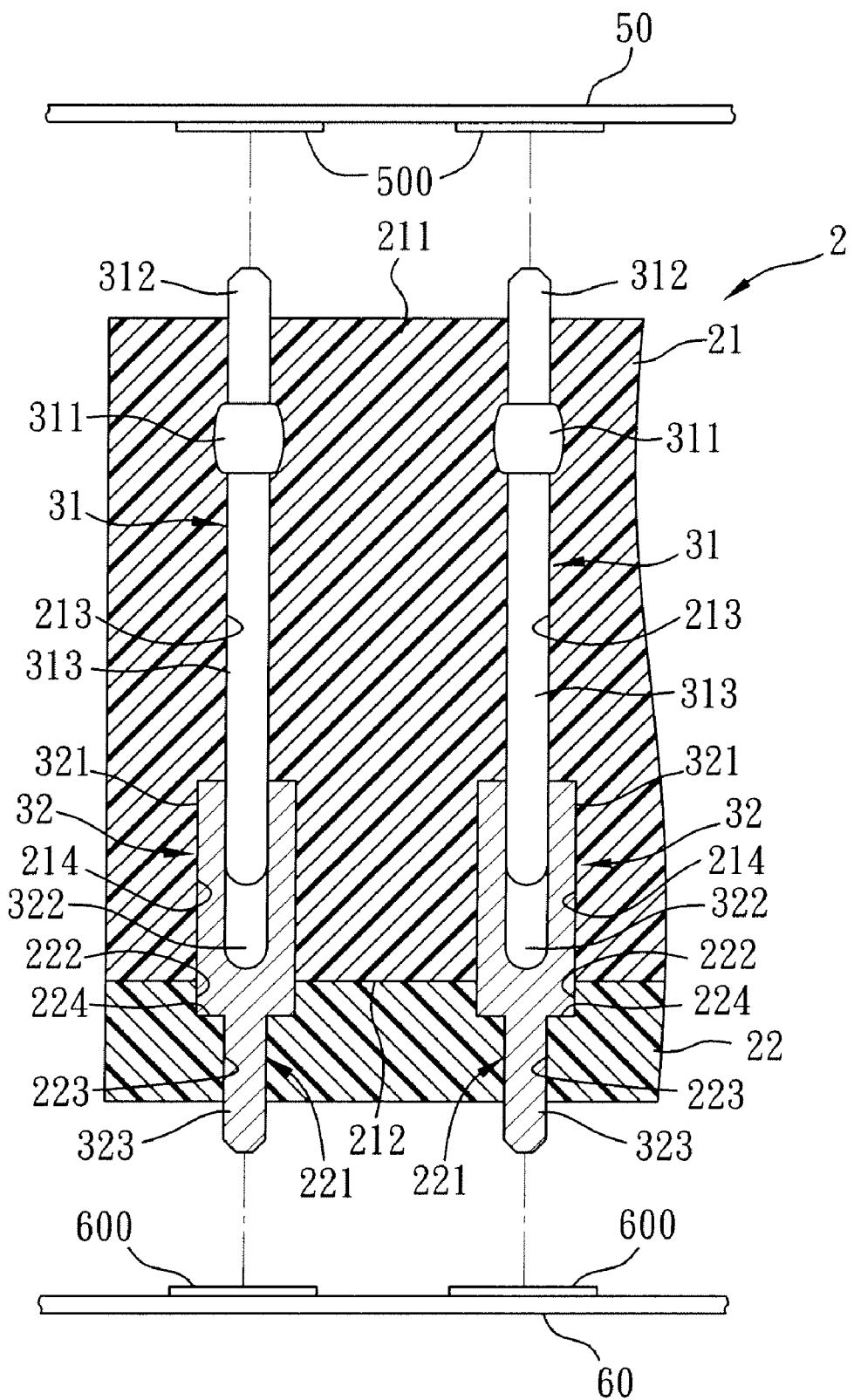
FIG. 2 is a fragmentary sectional view of a probe device according to the first preferred embodiment of the present invention.
Figure 3:
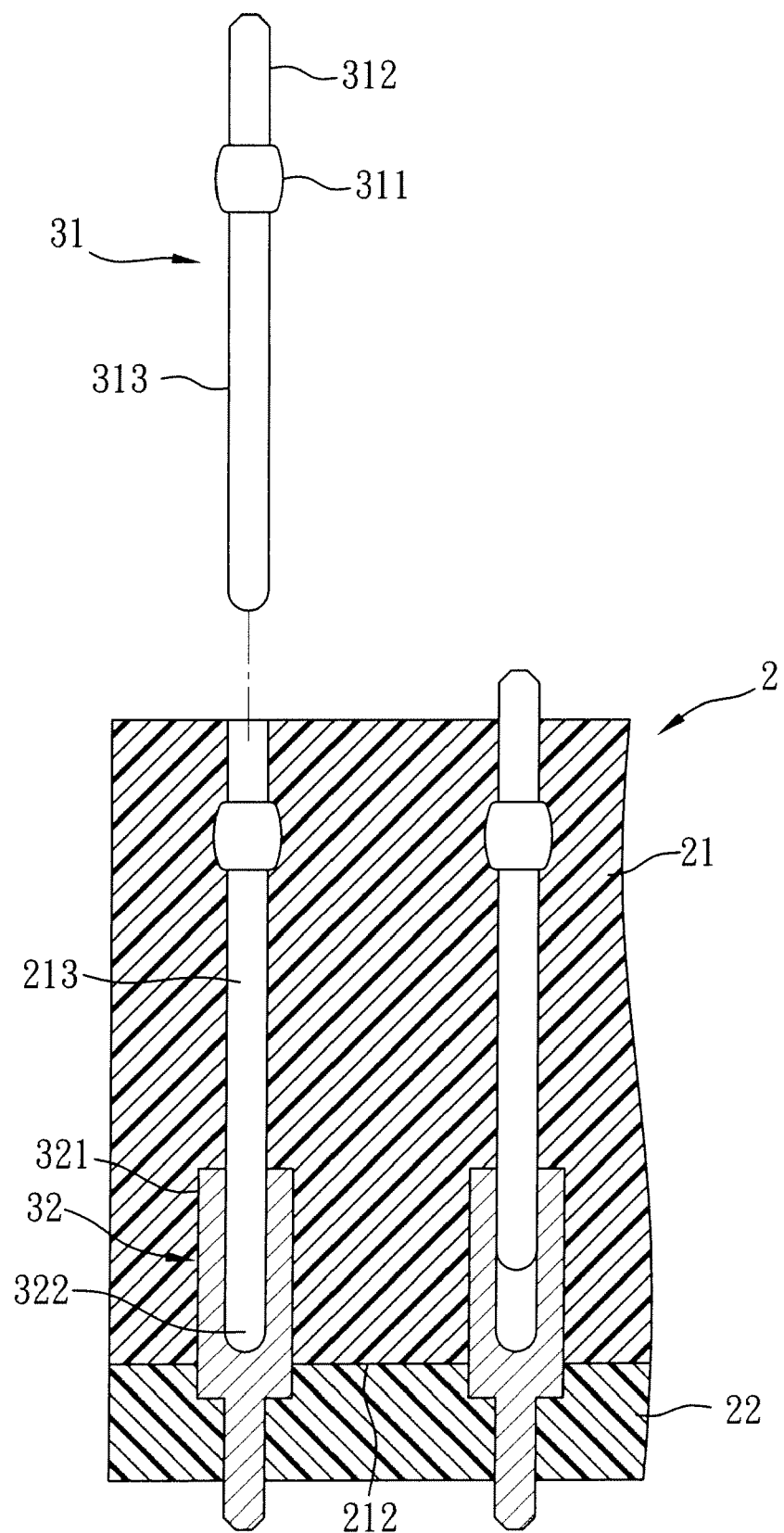
FIG. 3 is a fragmentary sectional view of the first preferred embodiment, illustrating how a first probe pin may be removed for replacement.

Referring to FIGS. 2 and 3, a probe device 2 according to the first preferred embodiment of the present invention is shown to comprise a buffer probe body 21, a plurality of spaced-apart first probe pins 31, a plurality of spaced-apart second probe pins 32, and a first retaining plate 22. The probe device 2 of the present invention is used for connecting electrically a test point 500 of a device under test 50, for example, a semiconductor device, to a test point 600 of a testing apparatus 60.

The probe body 21 is made of an elastomeric material, and has a first face 211 formed with a plurality of first holes 213 extending through the first face 211, and a second face 212 opposite to the first face 211 and formed with a plurality of second holes 214 extending through the second face 212 and aligned with the first holes 213. In this embodiment, the probe body 21 is made of silicone. In an alternative embodiment, the probe body 21 may be made of a plastic material capable of providing a cushioning effect.

Each of the first probe pins 31 is made of a conductive material, and is inserted fittingly and removably into a respective first hole 213. Each first probe pin 31 includes a bulged portion 311 disposed in the respective first hole 213, a first contact portion 312 extending from the bulged portion 311 and out of the first face 211 so as to contact electrically the test point 500 of the device under test 50, and a first connecting portion 313 extending from the bulged portion 311 opposite to the first contact portion 312. In this embodiment, the bulged portion 311, the first contact portion 312, and the first connecting portion 313 are formed integrally as one body.

Each of the second probe pins 32 is made of a conductive material, and is inserted fittingly and removably into a respective second hole 214. Each second probe pin 32 includes a second connecting portion 321 extending into the respective second hole 214 and having an insert space 322, and a second contact portion 323 extending from the second connecting portion 321 and out of the second face 212 so as to contact electrically the test point 600 of the testing apparatus 60. In this embodiment, the second connecting portion 321 and the second contact portion 323 of the second probe member 32 are formed integrally as one body, and the second connecting portion 321 has a cross section larger than that of the second contact portion 323. Further, each first probe pin 31 has a cross section smaller than that of each second probe pin 32. The first connecting portion 313 is inserted fittingly and removably into the insert space 322, and mates with the second connecting portion 321. As to the forming method of the first and second probe pins 31, 32, since the technical field involving plastic injection molding is known in the art, a detailed description thereof is dispensed herewith.

The first retaining plate 22 covers the second face 212, and has a plurality of spaced-apart third holes 221 aligned with the second holes 214. Each third hole 221 has a large cross section portion 222 proximate to the second face 212, a small cross section portion 223 communicating spatially with the large cross section portion 222 and distal from the second face 212, and a shoulder 224 between the large and small cross section portions 222, 223. The second connecting portion 321 has one end disposed in the respective second hole 214, and the other opposite end extending out of the respective second hole 214 and into the large cross section portion 222 and abutting against the shoulder 224. The second contact portion 323 extends through the small cross section portion 223 and out of the first retaining plate 22. Hence, through such a connection, the second probe pins 32 can be retained in the respective second holes 214 through cooperation of the probe body 21 and the first retaining plate 22.

To use the probe device 2 of the present invention, the first and second contact portions 312, 323 are brought to contact the respective test points 500, 600 so as to connect electrically the device under test 50 to the testing apparatus 60. Since the probe body 21 is made of elastomeric material, the probe body 21 is deformable to absorb the contact forces between the first and second contact portions 312, 323 and the respective test points 500, 600. The cushioning effect of the probe body 21 protects the test points 500,600 and the first and second contact portions 312, 323. At this time, the first connecting portion 313 extends deeper into the insert space 322 in the second connecting portion 321 so as to form a good electrical connection with the second connecting portion 321, so that signals can be transmitted effectively from the device under test 50 to the testing apparatus 60.

Since the first and second portions 312, 323 are in frequent contact with the respective test points 500,600 during test operations, the first and second contact portions 312, 323 are prone to wear easily, so that a damaged first or second probe pin 31, 32 must be replaced with a new one. To replace a damaged first probe pin 31, since the probe body 21 is resilient and deformable, and since the first face 211 is not covered with a retaining plate, the first contact portion 312 of the damaged first probe pin 31 is pulled out from the probe body 21. This may be done by hand or by using a pulling device, such as pliers or the like. A new first probe pin 31 is inserted into the first hole 213 until the first connecting portion 313 thereof extends into the insert space 322 in the second connecting portion 321 of the second probe pin 32. To replace a damaged second probe pin 32, the first retaining plate 22 is first removed from the second face 212 of the probe body 21, after which the damaged second probe pin 32 is pulled out from the probe body 21 in a manner similar to that used when removing a damaged first probe pin 31, so that a new second probe pin 32 can be inserted into the second hole 214. Hence, the first and second probe pins 31, 32 can be easily replaced, such that the entire probe device 2 need not be replaced with a new one when the first or second probe pin 31, 32 become damaged or worn.

Figure 4:
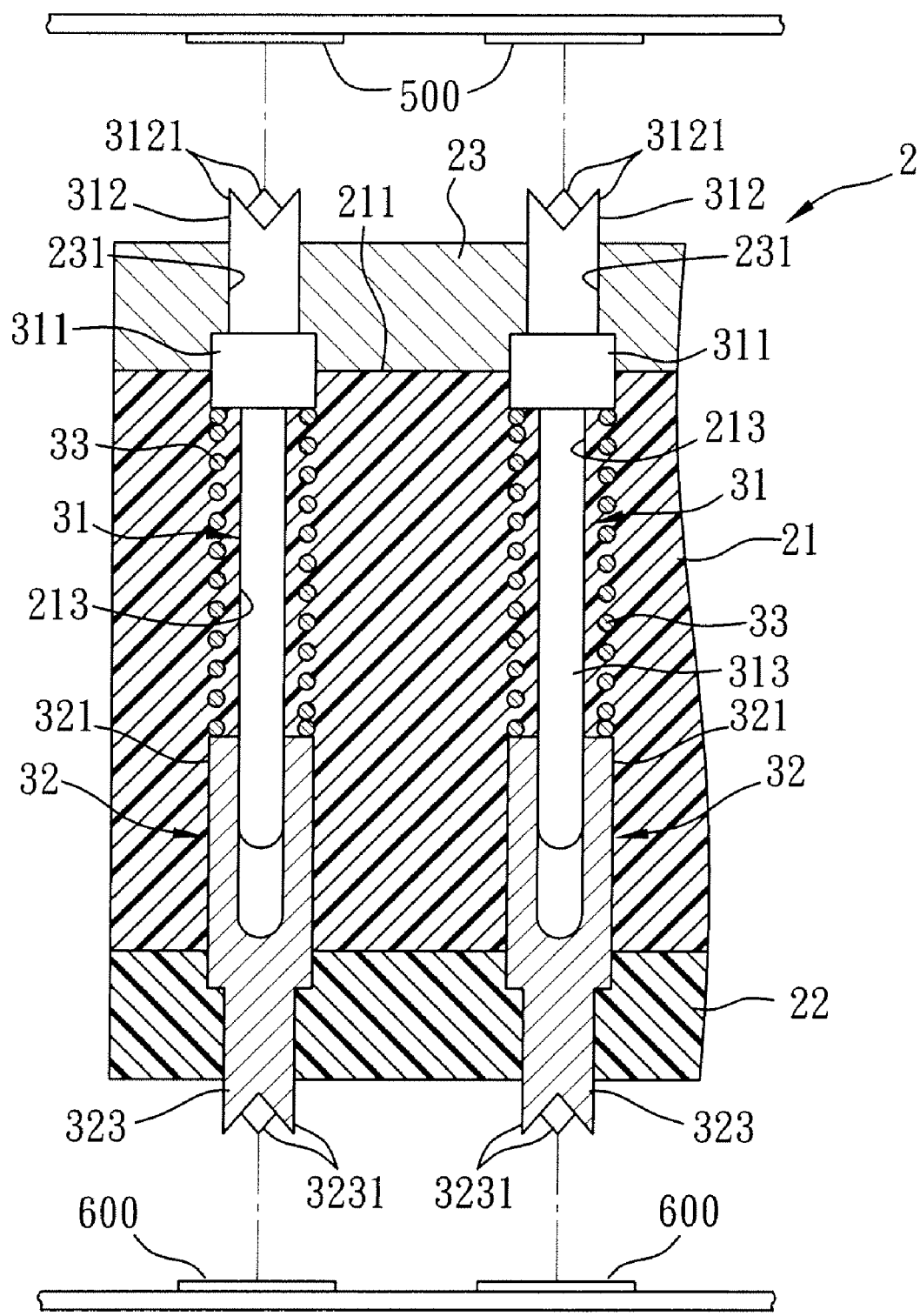
FIG. 4 is a fragmentary sectional view of a probe device according to the second preferred embodiment of the present invention.

Referring to FIG. 4, a probe device 2 according to the second preferred embodiment of the present invention is shown to be similar to the first preferred embodiment. However, in this embodiment, the probe device 2 further comprises a second retaining plate 23 covering the first face 211 of the probe body 21, and a plurality of biasing members 33 disposed in the probe body 21. The second retaining plate 23 is formed with a plurality of spaced-apart fourth holes 231 aligned with the first holes 213. The first contact portion 312 of each first probe pin 31 extends through a respective fourth hole 231 and out of the second retaining plate 23. Each of the first and second contact portions 312, 323 has a plurality of angularly spaced-apart tooth-contacting ends 3121, 3231 so as to increase the contact area with the respective test points 500, 600. Each biasing member 33 has two opposite ends abutting respectively against the bulged portion 311 of one of the first probe pins 31 and one end of the second connecting portion 321 of the respective second probe pin 32.

The advantage of this embodiment is that the resiliency of the probe body 21 can be further enhanced through the presence of the biasing members 33 in the probe body 21. Further, the cushioning effect of the probe body 21 can also be enhanced. Moreover, the provision of the second retaining plate 23 can further protect the probe body 21. When a damaged first probe pin 31 is to be replaced, the second retaining plate 23 is first removed from the first face 211 of the probe body 21, after which the damaged first probe pin 31 is pulled out from the probe body 21 in a manner similar to that described in the first preferred embodiment.

It is worth mentioning that the configurations of the first and second contact portions 312, 323 are not limited to the present disclosure, and may be varied according to the structures of the test points 500, 600.

Figure 5:
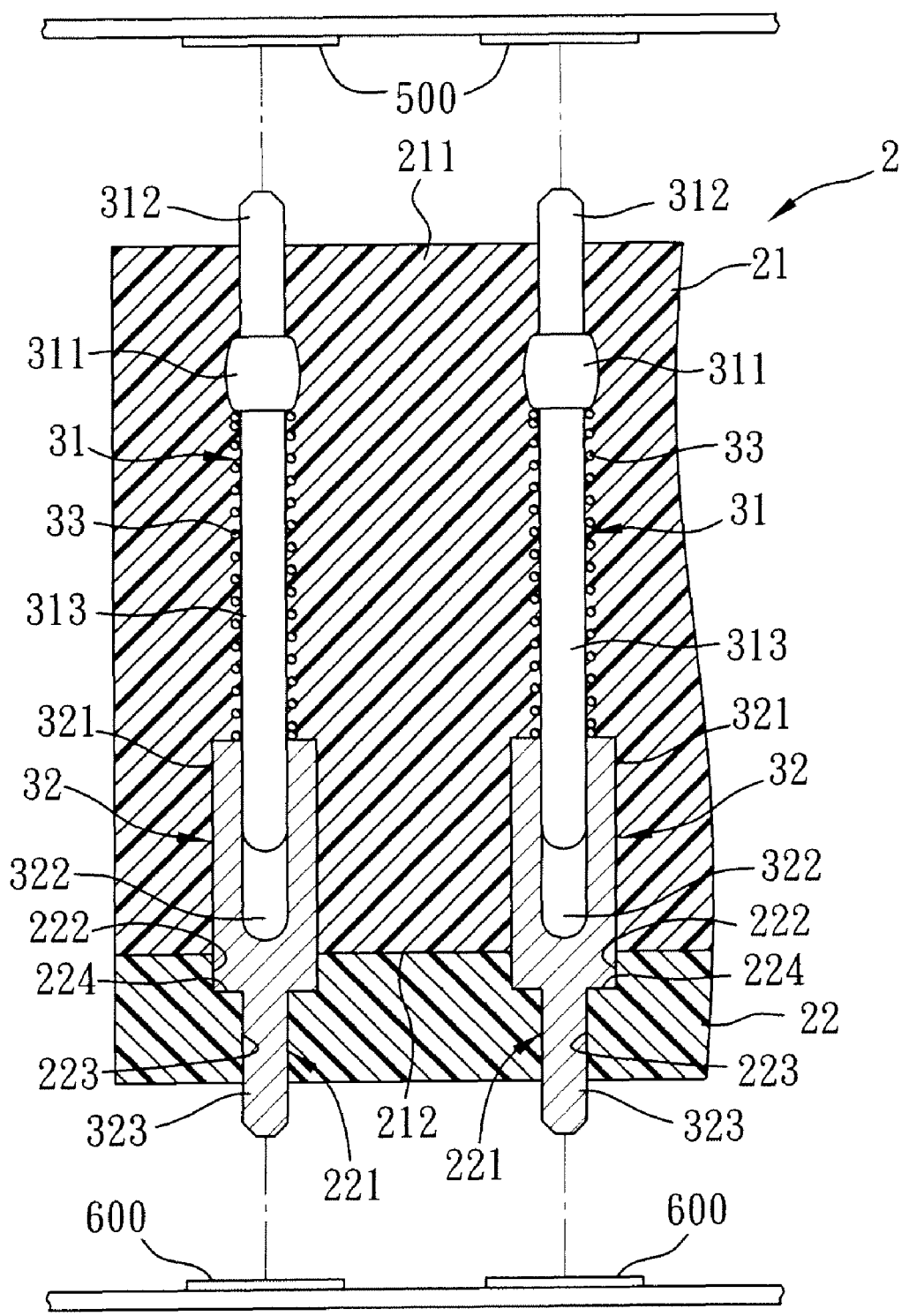
FIG. 5 is a view similar to FIG. 4, but illustrating a variation of the second preferred embodiment.

Referring to FIG. 5, the biasing members 33 may also be disposed in the probe body 21 of the first preferred embodiment so as to enhance the cushioning effect of the probe body 21.

From the aforementioned description, it is apparent that the scope of application of the probe device 2 of the present invention is broad, and the replacement of the first and second probe pins 31, 32 is easy.

While the present invention has been described in connection with what are considered the most practical and preferred embodiments, it is understood that this invention is not limited to the disclosed embodiments but is intended to cover various arrangements included within the spirit and scope of the broadest interpretations and equivalent arrangements.

I claim:

1. A probe device for connecting electrically a device under test to a testing apparatus, comprising:

a probe body made of an elastomeric material and having a first face provided with a plurality of first holes extending through said first face, and a second face opposite to said first face and having a plurality of second holes aligned with said first holes and extending through said second face;

a plurality of spaced-apart first probe pins each inserted fittingly and removably into one of said first holes, each of said first probe pins including a first contact portion extending out of said first face, and a first connecting portion extending into a respective one of said first holes;

a plurality of spaced-apart second probe pins each inserted fittingly and removably into one of said second holes, each of said second probe pins including a second contact portion extending out of said second face, and a second connecting portion extending into a respective one of said second holes and having an insert space, said first connecting portion being inserted fittingly and removably into said insert space and mating with said second connecting portion; and a first retaining plate covering said second face to retain said second probe pins respectively in said second holes, and having a plurality of third holes aligned with said second holes, said second contact portions of said second probe pins extending respectively through said third holes and out of said first retaining plate;

wherein each of said third holes has a large cross section portion proximate to said second face, a small cross section portion distal from said second face, and a shoulder between said large and small cross section portions, said second connecting portion having one end disposed in the respective said second hole, and the other opposite end extending out of the respective said second hole and into said large cross section portion and abutting against said shoulder, said second contact portion extending through said small cross section portion and out of said first retaining plate.

2. The probe device of claim 1, wherein said first connecting portion of each of said first probe pins has a cross section smaller than that of said second connecting portion of each said second probe pin, said second connecting portion having a cross section larger than that of said second contact portion.

3. The probe device of claim 1, wherein each of said first probe pins further includes a bulged portion disposed in the respective said first hole between said first contact portion and said first connecting portion.

4. The probe device of claim 3, further comprising a plurality of biasing members disposed in said probe body and each having two opposite ends abutting respectively against said bulged portion and said second connecting portion.

5. The probe device of claim 1, further comprising a second retaining plate covering said first face to retain said first probe pins respectively in said first holes, and having a plurality of spaced-apart fourth holes aligned with said first holes, said first contact portions of said first probe pins extending respectively through said fourth holes and out of said second retaining plate.

6. The probe device of claim 1, wherein each of said first and second contact portions has a plurality of angularly spaced-apart tooth-contacting ends.

* * * * *